United States Patent [19]

Morison

[11] 4,438,364
[45] Mar. 20, 1984

[54] PIEZOELECTRIC ACTUATOR

[75] Inventor: Rodney Morison, Huntington Beach, Calif.

[73] Assignee: The Garrett Corporation, Los Angeles, Calif.

[21] Appl. No.: 282,478

[22] Filed: Jul. 13, 1981

[51] Int. Cl.³ .......................................... H01L 41/10
[52] U.S. Cl. ................................... 310/328; 310/331; 310/355
[58] Field of Search .................... 310/328, 330–332, 310/355–357, 359, 365–366, 369; 356/350, 358

[56] References Cited

U.S. PATENT DOCUMENTS

| | | |
|---|---|---|
| Re. 27,116 | 4/1971 | Miller et al. . |
| 2,618,579 | 11/1952 | Brajer . |
| 3,458,915 | 8/1969 | Miller et al. . |
| 3,551,764 | 12/1970 | Evans .................... 310/328 X |
| 3,789,248 | 1/1974 | Jaecklin et al. ............ 310/355 |
| 3,831,043 | 8/1974 | Hoffmann et al. ........ 310/364 X |
| 3,903,435 | 9/1975 | Bouygues et al. ........... 310/328 |
| 3,940,974 | 3/1976 | Taylor ................. 310/331 X |
| 4,087,716 | 5/1978 | Heywang ............... 310/359 X |
| 4,160,184 | 7/1979 | Ljung ..................... 310/328 |

*Primary Examiner*—Peter S. Wong
*Attorney, Agent, or Firm*—John H. Lynn; Leslie S. Miller; Albert J. Miller

[57] ABSTRACT

A low voltage, high frequency actuator for correcting distortions in laser optics systems.

19 Claims, 10 Drawing Figures

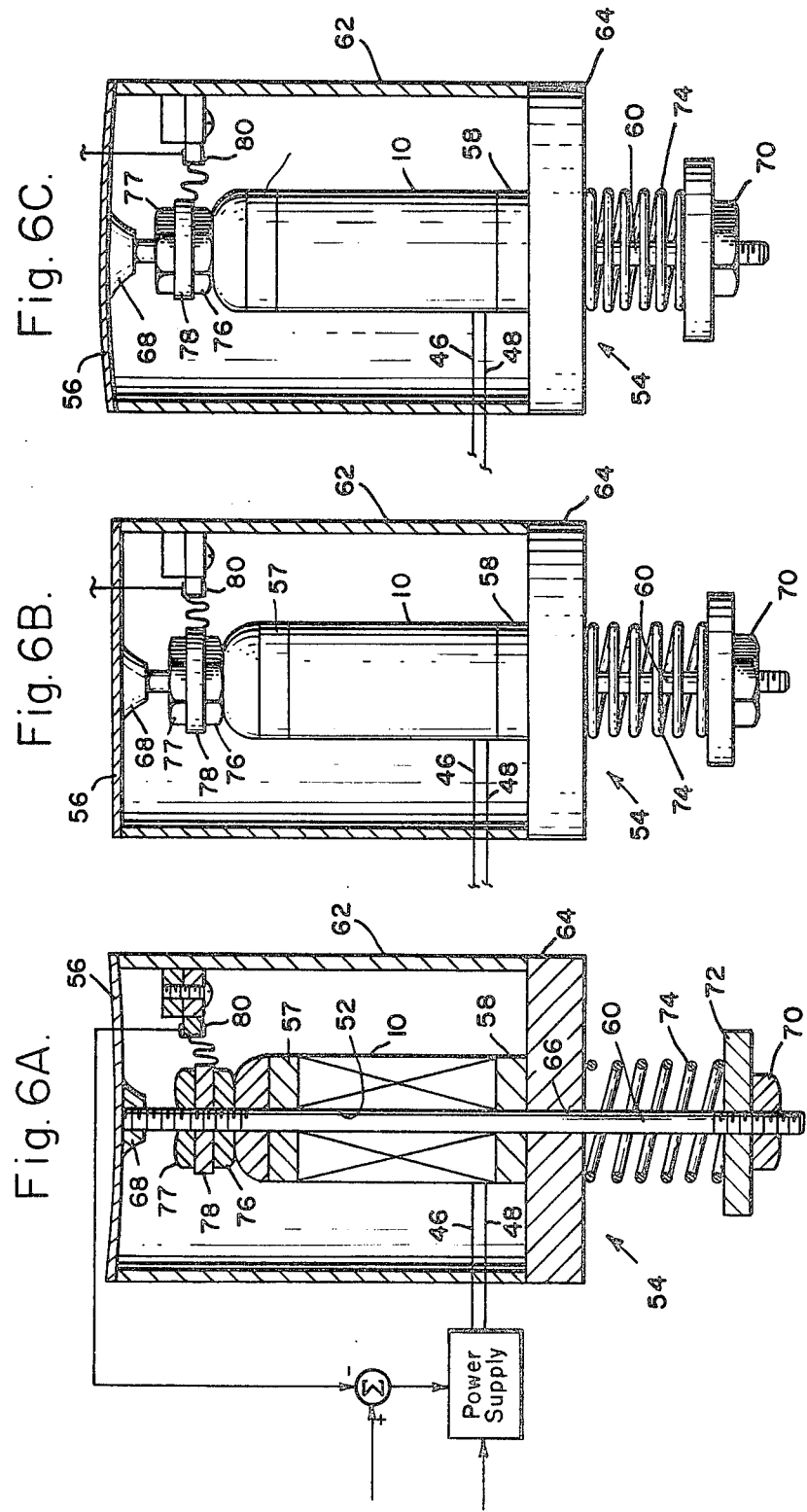

PIEZOELECTRIC ACTUATOR

BACKGROUND OF THE INVENTION

1. Field of the Invention

The present invention relates generally to electromechanical actuators and particularly to piezoelectric actuators used to create high forces through small displacements for applications such as bending mirrors in laser optics systems.

2. Description of the Prior Art

The problem of maintaining a focused laser beam while the beam is traveling through a medium such as air has produced substantial difficulty even though advances in laser technology permit the projection of a laser beam over great distances. The energy concentration of a laser beam is higher in the central portion of the cross-sectional area than at the periphery; therefore, a laser beam heats the medium through which the beam travels more at the center of the beam than at the periphery thereof. Heating a gaseous medium, such as air, changes the index of refraction; thus the index of refraction at the center of the beam differs from that at the edges of the beam. The variation in refractive index of the medium causes the beam to refract toward the cooler gas regions, a condition known as blooming, which destroys the previous sharp focus of the beam.

Vibrations and distortions in the laser system optical elements also degrade beam sharpness. While the use of specially vibration-free stabilized optical benches and tables avoids the vibration problem in laboratory environments, the effects of vibrations become highly critical in applications of laser systems outside the laboratory. One solution to the problem of poorly focused laser beams is to bend or distort the reflecting surface of the laser apparatus to modify the optics and, thereby, compensate for undesired distortion to focus the beam at a predetermined location. To achieve focusing through mirror bending, it is necessary to adjust several surface bending points as described in "Phase Compensation for Thermal Blooming" by Lee C. Bradley and Ian Hermann in Applied Optics, Vol. 13, No. 2, p332.

Prior art methods of bending laser mirrors have deficiencies which limit the utility thereof in practical laser applications. Two of the most common deficiencies in the prior art are a failure of the mirror bending apparatus to achieve bending rapidly enough to compensate for vibration distortions, and the requirement of a very high voltage power source for supplying the necessary driving power. Although described with reference to laser technology, the foregoing deficiencies are common in any actuator application to a load which requires a high force with small displacement in a very short time interval.

Some prior art devices for bending laser mirrors include piezoelectric actuators incorporating single crystals and monolithic devices, which have exhibited both of the hereinabove mentioned deficiencies. A piezoelectric material produces a potential difference in response to the application of pressure thereto; and conversely, the application of a potential difference to a piezoelectric material produces a change in the physical dimensions thereof and, therefore, a force in the direction of the electric field. Single piezoelectric crystals and polycrystalline single body monolithic piezoelectric devices are unable to produce forces and displacements having magnitudes sufficient to bend laser mirrors with a response time to compensate for vibrational distortions. In addition, prior art systems using piezoelectric actuators to produce forces sufficient to bend laser mirrors have required excessively high power supply voltages, which necessitate the use of circuit components having substantial size and weight, which, along with the costs involved, have limited the utility of such devices to laboratory applications. Other prior art mirror bending methods are also expensive with response times of undesirably long duration and have the additional problem of being unable to accurately provide the high force required to bend the laser mirror.

Accordingly, there is a need in the art for a low-cost actuator which accurately provides an output force and a response time adequate for compensating for distortions in laser optics systems.

SUMMARY OF THE INVENTION

The present invention overcomes the deficiencies of the prior art by providing a piezoelectric actuator building block having a plurality of relatively thin, flat piezoelectric layers stacked with micro-thin noble metal electrodes therebetween with the electrodes and the piezoelectric layers being sintered into a monolithic chip. An actuator, consisting of a multiple stack of these chips, according to the present invention is capable of providing a force adequate to bend a laser mirror to compensate for thermal blooming and has a response time sufficient to compensate for vibrational distortions in laser optic systems. An actuator according to the present invention permits the use of a driving power source having a relatively low voltage which permits the use of compact, inexpensive, solid state electronic controls, which when combined with the innate stiffness of thin piezoelectric ceramic discs, results in rapid transmission of force from the actuator to a load attached thereto, such as a laser mirror. The piezoelectric disc chips have relatively small diameters; and the forces available therefrom permit close packing of the individual disc stacks, which allows high frequency adjustment of the mirror driving points to provide dynamic control of complex load surface contours to compensate for distortions in laser mirrors. Thus, the present invention eliminates much of the high cost of controls for piezoelectric actuators which provide forces high enough for bending laser mirrors with response times low enough for varying load conditions.

BRIEF DESCRIPTION OF THE DRAWINGS

FIGS. 6A–6C illustrate an application of an actuator according to the invention;

DESCRIPTION OF THE PREFERRED EMBODIMENT

The aggregate of a ferroelectric ceramic material that has cooled from a high sintering temperature includes a multitude of randomly oriented crystallites. Each crystallite is strongly piezoelectric because each crystallite possesses domains having permanent electric dipole moments, so that changes in the electrical charge distribution appear at certain crystal surfaces under compression or tension; and, conversely, dimensional changes occur under the influence of an externally applied electric field. In the gross aggregate, the electric dipoles cancel one another due to the random mix of crystallite orientations. A body of such ceramic material may be permanently polarized to approach the degree of piezoelectric activity of an ideal single crystal of the same material because of the existence within each crystallite of at least six different spatial directions in which the crystallite may become polarized. At temperatures below the Curie temperature, if a sufficiently strong direct current electric field is applied to the ceramic body, the previously randomly oriented crystallites will polarize along any of the permissible directions that are aligned closely enough with the direction of the applied electric field. Removal of the externally applied electric field after reducing the temperature results in permanent polarization of the ceramic body, thereby providing piezoelectric properties similar to those of a single crystal.

Figure 1:
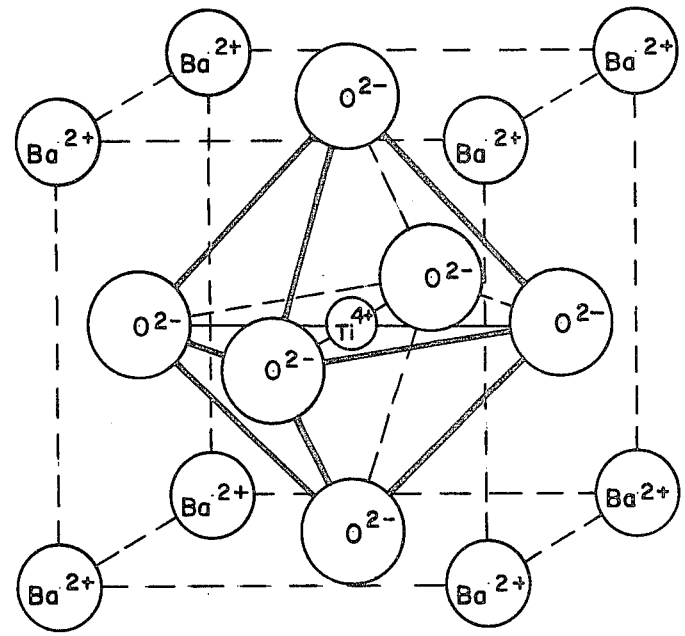
FIG. 1 represents a $BaTiO_3$ unit cell above the Curie temperature.
Figure 2:
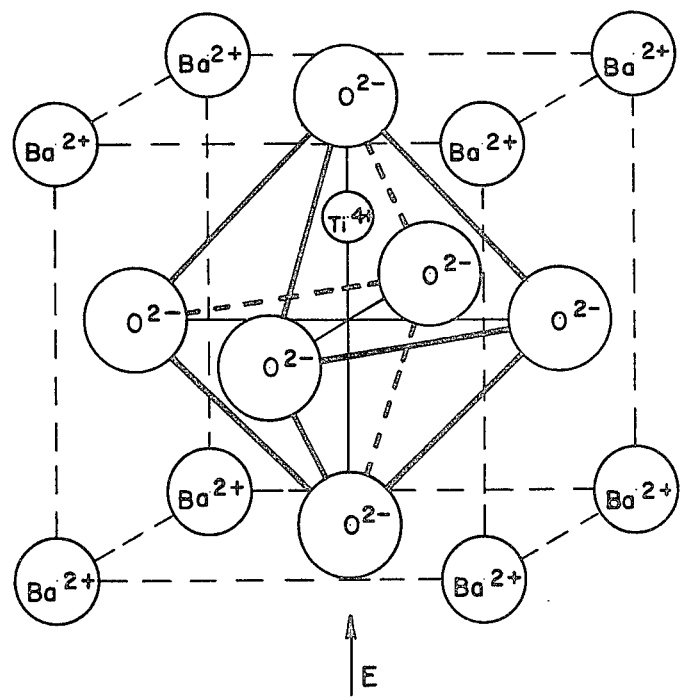
FIG. 2 represents a $BaTiO_3$ unit cell below the Curie temperature under the influence of an external electric field.

FIGS. 1 and 2 illustrates the structure of barium titanate ($BaTiO_3$), which provides a simplified example of how permanent electric polarization may occur in a ferroelectric ceramic material. Referring to FIG. 1, barium titanate is characterized by the stable octahedral network of six oxygen ions in relation to the central $Ti^{4+}$ ion; and at temperatures above the Curie temperature, the equilibrium position of $Ti^{4+}$ ion is centrally located in the octahedron defined by the six oxygen ions so that no net electric dipole exists in the crystal. The oxygen and barium ions are shared with the adjacent cells in the crystal structure; and the unit cell repeats to produce a crystal lattice. As the temperature continues to be reduced below the Curie temperature, the centrally located titanium position within the oxygen ion octahedron increasingly becomes unstable so that applying an external electric field E to pole the ferroelectric ceramic material, causes the titanium ion to assume a stable new position at an energy minimum away from the center of the octahedron along a line connecting opposite corners thereof as illustrated in FIG. 2. The displacement of the titanium ion is exaggerated in FIG. 2 to illustrate the effect with clarity. The displaced position of the titanium ion represents a low-energy, stable configuration, thereby resulting in the creation of a permanent electric dipole in each unit cell. This electric dipole structure is repeated in the same direction of polarization throughout an individual crystallite domain.

The titanium ion displacement is equally stable off-center toward anyone of the six oxygen ions, which defines six different polarization directions. Similarly, rhombohedral crystal symmetry yields eight equivalent directions; and orthorhombic crystal symmetry yields twelve equivalent directions. It is this multiplicity of polarizing directions that makes it possible for an aggregate of randomly oriented crystallites to be poled and thereby behave like a single large crystal. If each of the randomly oriented crystallites has a multiplicity of polarizing directions, it is highly probable that one of the polarizing directions will be sufficiently aligned with an externally applied electric field for poling to occur.

During the poling process, the crystal cell dimensions increase in the direction of the polarizing field and contract in directions perpendicular to the polarizing field. After removal of the poling field, there is some remanent dimensional distortion, and thereafter the poled ceramic body will increase in length along the poled axis proportionally to the field strength when an applied field below the saturation level is in the same direction as the original poling field. The length of the ceramic body decrease if the magnitude of the applied electric field decreases or if the field polarity reverses. In utilizing piezoelectric ceramics for displacement actuators, operating conditions must be controlled to prevent depoling the material. Applications of reverse fields of increasing amplitude may result in progressive depoling by flipping the dipoles 180° to the opposite stable positions. Excessive force exerted along the elongated, poled axis may produce depoling by forcing the polar axis into one of the transverse stable positions; depoling may also result from applications of very high slope step changes in the applied electric field.

Figure 3:
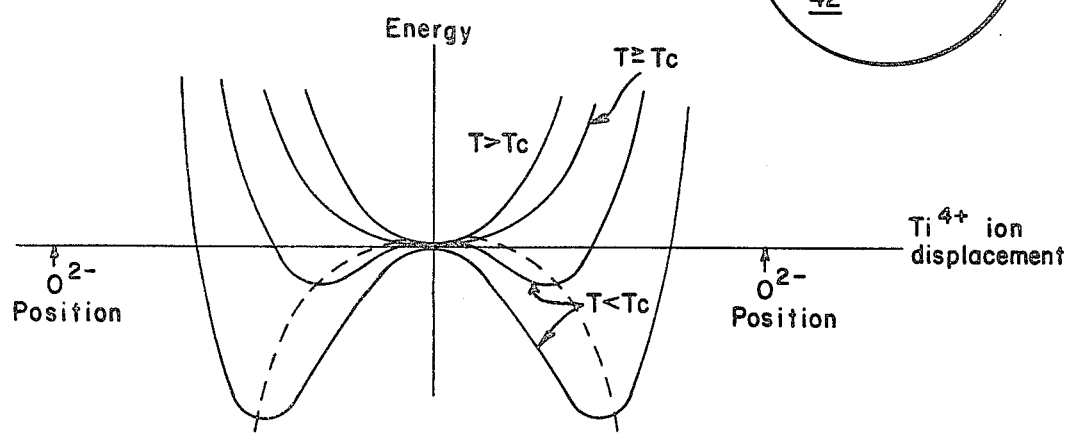
FIG. 3 represents the energy levels of $BaTiO_3$ as a function of $Ti^{4+}$ ion position in the unit cell.

FIG. 3 depicts the relationship between energy, temperature and titanium ion displacement about the unit cell center for a typical ferroelectric crystal. There are two stable-position energy minima along each axis defined by the oxygen ions. As the temperature increases, these minima move up the energy scale and move closer together along the dashed line until the minima disappear; and the structure becomes symmetric and unpolarized. Application of a DC electric field raises one minimum until it effectively disappears and lowers the other, resulting in poling of the material in the direction of the lowered energy well. The raising of energy minima at elevated temperatures aids in changing the polarity of the material. Therefore, when an alternating electric driving potential is applied to the ceramic body it is necessary to provide effective heat transfer therefrom to avoid excessive elevation of the temperature therein and resultant depoling. The primary source of heat within the ceramic body is hysteresis. The present invention affords a two-thirds reduction in hysteresis losses over prior art devices by polishing and coating the ceramic material as described hereinafter.

Figure 5:
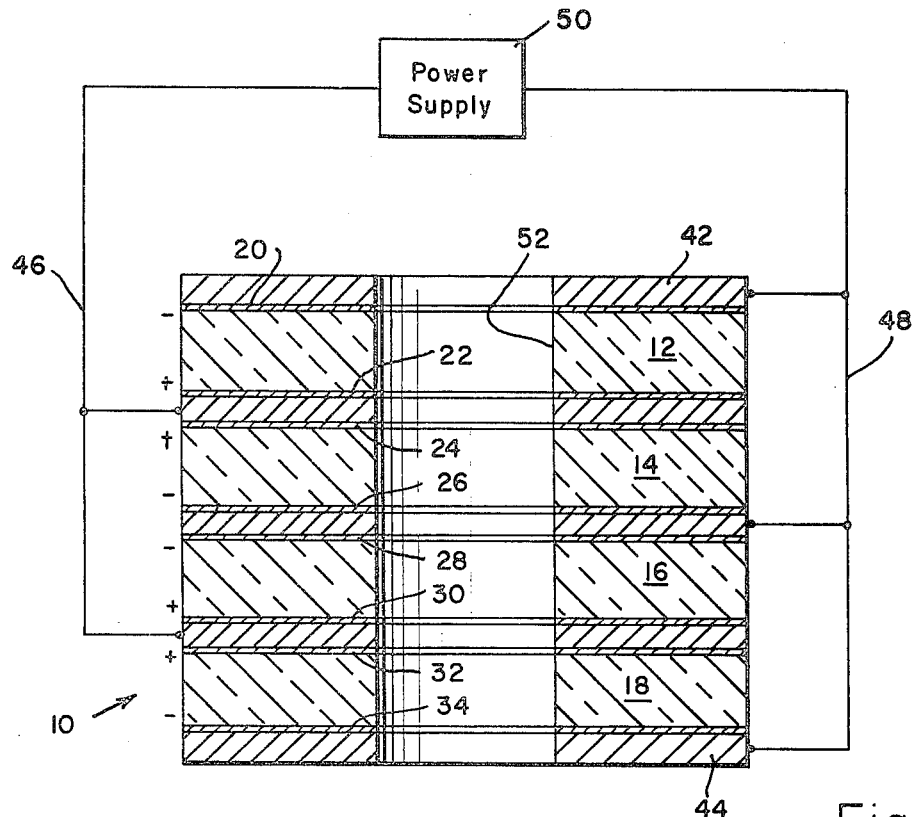
FIG. 5 is a cross-sectional view of the actuator of FIG. 4 taken along line 5—5.

FIG. 5 illustrates a cross-section of a stack 10 comprising a plurality of piezoelectric ceramic layers, which are preferably piezoelectric ceramic discs 12, 14, 16, and 18 which have electrodes 20, 22, 24, 26, 28, 30, 32 and 34 attached thereto with electrodes 20 and 22 covering opposite planar surfaces of disc 12. Similarly, electrodes 24 and 26 cover opposite planar surfaces of disc 14; electrodes 28 and 30 cover opposite planar surfaces of disc 16; and electrodes 32 and 34 cover opposite planar surfaces of disc 18. Electrodes 20, 22, 24, 26, 28, 30, 32 and 34 may be attached to piezoelectric ceramic discs 12, 14, 16, and 18 by any suitable method, such as firing on silver frit having a thickness of about 0.001 inches or vacuum depositing a tungsten-gold thin film having a thickness of approximately 6 microinches. Before vacuum deposition of the tungsten-gold film, the planar surfaces of piezoelectric ceramic discs 12, 14, 16, and 18 are preferably polished flat to reduce surface irregularities. Polishing piezoelectric ceramic discs 12, 14, 16, and 18 provides an actuator stroke which is about 20% greater than the stroke of a comparably sized actuator constructed according to prior art actuator fabrication techniques. The improved stroke results from the deposition of a flat electrode layer of uniform thickness on the flat planar surfaces of piezoelectric discs 12, 14, 16 and 18, which permits the uniform application of voltage over the planar surface areas of electrodes 20, 22, 24, 26, 28, 30, 32 and 34 to produce a uniform electric field within each piezoelectric ceramic disc 12, 14, 16, and 18. The uniform electric field causes substantially all of the piezoelectric material to contribute to the actuator stroke.

Tungsten-gold electrodes, in addition to being thinner than silver frit electrodes, have the added advantage of being less compressible than silver frit electrodes. In a stack 10 comprising 100 piezoelectric discs, the total thickness of silver frit electrodes is about 0.2 inches, but the thickness of tungsten-gold electrodes for 100 piezoelectric discs is only about 0.0012 inches. Therefore, a stack 10 comprising tungsten-gold electrodes as described hereinabove would provide a greater net stroke for a given applied voltage than would a stack 10 comprising silver frit electrodes because the tunsten-gold electrodes would compress less than the silver frit electrodes.

To provide an electrical connection to electrodes 22 and 24, a conducting shim 36 made of a suitable material, such as brass, may be placed therebetween. Similar conducting shims 38 and 40 may be placed between electrodes 26 and 28 and electrodes 30 and 32 respectively; and conducting shims 42 and 44 may be placed adjacent electrodes 20 and 34, respectively. Conducting shims 36 and 40 are connected to a bus 46, and the conducting shims 38, 42, and 44 are connected to a bus 48 for connection to a power supply 50.

Figure 4:
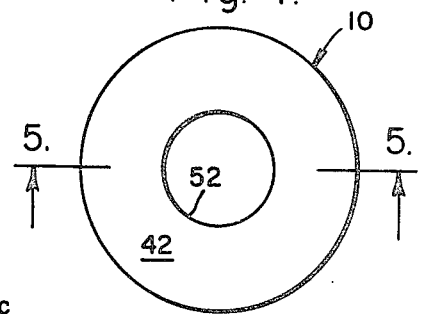
FIG. 4 is a plan view of an actuator according to the invention.

Referring to FIGS. 4 and 5, stack 10 has a central passage 52 therein with typical dimensions of piezoelectric ceramic discs 12, 14, 16, and 18 including an outside diameter of approximately 0.5 inch and an inside diameter for central passage 52 of about 0.2 inch. Stack 10 of piezoelectric ceramic discs 12, 14, 16, and 18 with electrodes 20, 22, 24, 26, 28, 30, 32 and 34 attached thereto and brass shims 36, 38, 40, 42 and 44 adjacent the corresponding electrodes is assembled with an adhesive, such as vacuum-degassed epoxy between all mating surfaces; and stack 10 is placed in compressive preloading to squeeze out excessive adhesive and to insure good mechanical and electrical contact within the stack 10. As a final step to remove possible air pockets, stack 10 may be exposed to a vacuum of 28 inches of mercury for 6 consecutive 5-second periods before oven heating at approximately 170° for about 2.5 hours to cure the adhesive, it being noted that detailed securement procedures may vary substantially depending upon the nature of the adhesive used.

Prior to the assembly of the stack 10, the piezoelectric ceramic discs 12, 14, 16, and 18 are poled in the manner described hereinabove with a poling voltage gradient of about 100,000 volts/inch. The piezoelectric ceramic discs 12, 14, 16, and 18 are stacked such that like dipoles in adjacent discs face one another. To avoid depoling, the electric field applied to each of the piezoelectric ceramic discs 12, 14, 16, and 18 should be of the same polarity as the original poling field; therefore, power supply 50 has the positive terminal thereof connected to bus 46 and the negative terminal connected to bus 48. Therefore, the surfaces of piezoelectric ceramic discs 12, 14, 16, and 18 connected to bus 46 have positive polarity and the surfaces of piezoelectric ceramic disc 12, 14, 16, and 18 connected to bus 48 have negative polarity. With the electrodes 20, 22, 24, 26, 28, 30, 32 and 34 and shims 36, 38, 40, 42 and 44 interdigitated between the piezoelectric ceramic discs 12, 14, 16, and 18, the electric field which results from application of the power supply voltage, V, is in the proper direction in each of the piezoelectric ceramic discs 12, 14, 16, and 18 to avoid depoling and to enhance the repulsion of like poles. The magnitude of the applied electric field in each of the piezoelectric ceramic discs 12, 14, 16, and 18 is equal to the applied voltage divided by the thickness of the disc; and for applications such as bending laser mirrors, the electric field strength in the individual discs must be as high as 50,000 volts/inch to produce the required forces. The opposing polarities of the piezoelectric ceramic discs 12, 14, 16 and 18 and electrodes 20, 22, 24, 26, 28, 32 and 34 being interdigitated therebetween permit realization of the required electric fields by a power supply having a relatively low voltage, thus overcoming a difficulty associated with prior art piezoelectric actuators.

In order to correct for distortions in laser optics sytems, the stack 10 must be capable of exerting a force of up to 100 pounds on a laser mirror at a displacement of approximately $1.67 \times 10^{-3}$ inch and have a frequency response from DC to 1,000 Hz. The invention provides the required 100 lb. force and displacement over a wide voltage range depending on the thickness and number of piezoelectric ceramic in the stack. For V=2,000 volts, the maximum thickness of piezoelectric ceramic discs 12, 14, 16, and 18 made of lead zirconate titanate is about 0.040 inches to give the required 50,000 volts/inch gradient. The achievement of the desired displacement of $1.67 \times 10^{-3}$ inch requires approximately 100 piezoelectric ceramic discs having a thickness of about 0.040 inch. If the power supply voltage V is limited to 200 volts, the maximum thickness of each piezoelectric ceramic disc 12, 14, 16, and 18 is 4 mils, or 75 volts for 1.5 mils thickness.

Polishing the planar surfaces of piezoelectric ceramic material and depositing tungsten-gold electrodes thereon as described hereinabove permits the use of layers of piezoelectric material having a thickness of a few mils in the construction of stack 10, which permits the provision of the required 50,000 volt/inch gradient in the piezoelectric material with power supply voltages an order of magnitude less than those used in conventional piezoelectric actuators. A $1.67 \times 10^{-3}$ inch displacement for a supply voltage V=200 volts requires about 850 piezoelectric discs about 4 mils thick with the actual member of piezoelectric discs depending upon the thickness and compressibility of the electrode material.

FIGS. 6A-6C illustrate an actuator 54 according to the present invention being applied to control the configuration of a laser mirror 56. Actuator 54 includes an end cap 57 connected to one end of the stack 10 with a similar end cap 58 being connected to the other end thereof. Actuator 54 includes an actuator rod 60 through central passage 52. Laser mirror 56 is mounted on a frame 62 which includes a base 64 having a passage 66 therein for admitting the actuator rod 60 through base 64. One end of the actuator rod 60 is connected to laser mirror 56 by any suitable means, such as a nut 68; and the other end of the actuator rod 60 extends through base 64 to a first preload nut 70 threadedly connected thereto for holding a washer 72 and a preload spring 74 on the actuator rod 60 between the base 64 and the first preload nut 70. A second preload nut 76 is threadedly connected to the actuator rod 60 and bears against end cap 57 with preload nuts 70 and 76 being adjusted such that preload spring 74 exerts a predetermined compressive force on stack 10 such that when $V=0$, actuator 54 pulls the laser mirror 56 into a concave configuration. A nut 77 holds a washer 78 against the preload nut, and a displacement transducer assembly 80 connected to washer 78 provides means for measuring the displacement of the actuator rod 60. Displacement transducer 80 provides an output signal indicative of the actual displacement of actuator rod 60 (and thus the configuration of laser mirror 56) to an input of a summing circuit 82, which also has an input terminal for receiving a displacement command signal indicative of a selected displacement of actuator rod 60. Summing circuit 82 processes the signals input thereto and produces an actuator control signal which is input to power supply 50 for controlling the voltage output thereof. Leads 46 and 48 connect the output of power supply 50 to the stack 10, which is constructed as shown in FIGS. 4 and 5.

Preload spring 74 and preload nuts 70 and 76 are adjusted such that when $V=0.5\ V_{max}$, laser mirror 56 is planar as shown in FIG. 6B; and the mirror is convex as shown in FIG. 6C when $V=V_{max}$. Thus, variation of power supply voltage V between $V=0$ and $V=V_{max}$ provides infinite adjustment of the configuration of laser mirror 56 between first and second predetermined configurations such as a configuration of maximum concavity illustrated in FIG. 6A and a configuration of maximum convexity illustrated in FIG. 6C. Preloading the stack 10 permits adjustment of the configuration of laser mirror 56 through the entire desired range without reversing the polarity of power supply voltage V, thereby permitting operation of actuator 54 with applied fields which are in the same direction as the original poling field to prevent depoling.

FIGS. 6A–6C exemplify the use of an actuator 54 according to the invention to control the configuration of a portion of a laser mirror 56. In practical laser optics systems a plurality of such actuators may be connected to a single laser mirror for controlling the configuration thereof to compensate for distortions in the laser beam.

Figure 7:
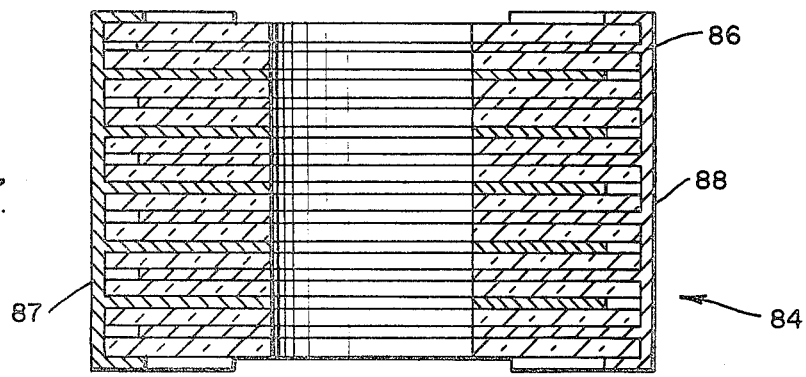
FIG. 7 is a cross-sectional view of a piezoelectric expander chips.

FIG. 7 illustrates an actuator chip 84 which comprises a plurality of piezoelectric discs 86 having thicknesses as small as about 1.5 mil, a positive electrode 87 and a negative electrode 88 interdigitated between adjacent piezoelectric discs 86. Actuator chip 84 is particularly suitable for low-voltage applications since a power supply voltage of only 75 volts is sufficient to provide a 50,000 volt/inch gradient across a thickness of 1.5 mil. Construction of actuator chip 84 involves casting individual green, or unfired, discs; printing the green discs with an ink which contains a metal to form electrodes thereon; stacking the green dics after printing; and firing the stack of green discs to produce monolithic structure.

Figure 8:
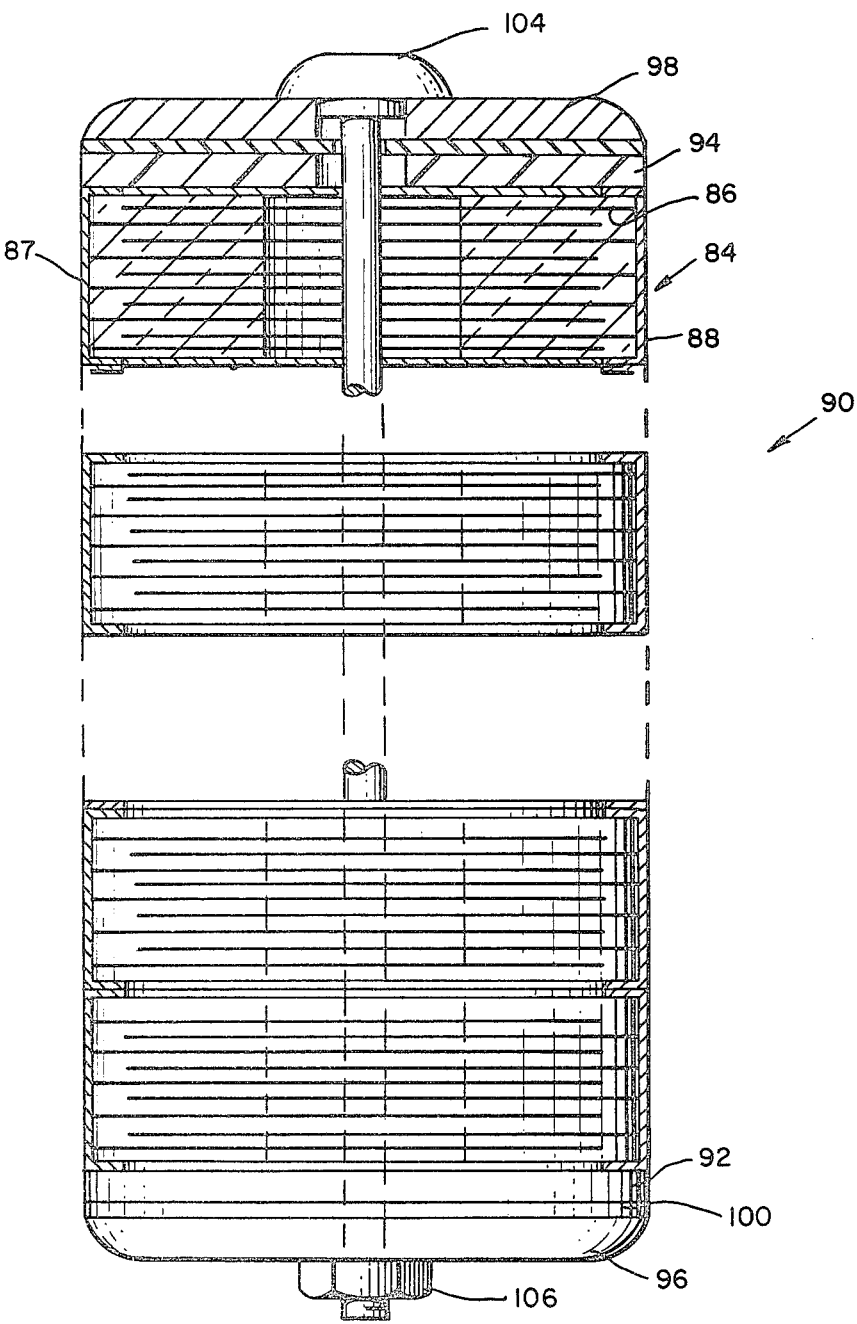
FIG. 8 is a cross-sectional view of an actuator stack comprising a plurality of piezoelectric expander chips according to FIG. 7.

FIG. 8 illustrates an actuator stack 90 which comprises a plurality of actuator chips 84 with the number of actuator chips 84 being chosen to meet actuator displacement requirements. Actuator stack 90 may be used instead of stack 10 in the device of FIGS. 6A–6C. Actuator stack 90 includes a pair end insulators 92 and 94, a pair end plates 96 and 98 and may include a potting release disc 100 made of a synthetic resin material between end plate 96 and end insulator 92 with a second potting release disc 102 between end of plate 98 and end washer 94. A preload bolt 104 and preload nut 106 apply a preload to actuator chips 84 and hold actuator stack 90 together while the synthetic resin material cures. Preferably, actuator 90 includes a suitable adhesive material between adjacent actuator chips 84 to fill gaps and to bond adjacent actuator chips 84 together. Similarly, an adhesive bonds end insulator 92 and 94 to their respective adjacent actuator chips.

A thickness of about 70 mils is representative of the maximum thickness obtained from constructing actuator chip 84 from piezoelectric ceramic layers having a thickness of about 1.5 mils. To provide an active piezoelectric ceramic material length of about 4 inches, which is equivalent to a 100 disc stack of 40 mil thick discs, requires a total of about 54 actuator chips 84 each having a thickness of about 70 mils.

The advantages of applying the hereinabove described techniques to form actuator 90 to produce a high force, small excursion piezoelectric actuator include:

1. Permitting operation with compact, economical, low-voltage driving electronics;

2. The use of clipping to limit high-voltage transients in low-voltage power supplies to eliminate destructive transient arc-over inherent in high-voltage driving electronics required to drive thick-dics actuators;

3. Manufacturing with fewer steps than are required to produce an actuator comprising individual ceramic discs;

4. Providing more intimate physical contact between the electrode surfaces and the piezoelectric material than is obtainable by polishing and thin film deposition processes on thick discs;

5. Proving more effective conduction of heat from the thin ceramic discs by the electrode layers than is possible with thick ceramic discs;

6. Permitting the construction of actuator having a predetermined displacement or excursion by stacking a predetermined number of actuator chips 84 in the assembly of actuator stack 90; and 7. Permitting poling of the entire stack at once.

Although the invention is described with reference to piezoelectric ceramic materials, it is possible to construct an actuator according to the present invention using thin plastic sheet materials such as polyvinylidene fluoride with electrodes formed thereon by metal sputtering or by evaporation.

Although the present invention has been illustrated and described with reference to a specific preferred embodiment, it should be understood that the present invention is not limited thereto and that the appended claims define the scope of the invention.

What is claimed is:

1. An actuator for producing a force on a load in response to a single polarity D.C. voltage, comprising:
   a stack of layers of a piezoelectric material having a central passage therethrough, each of the layers in said stack being not greater than 4 mils in thickness, each of said layers being poled to have an electrically positive surface and an electrically negative surface, said layers being positioned such that adjacent surfaces have like electrical polarities;
   a first electrode connected to said electrically positive surfaces;
   a second electrode connected to said electrically negative surfaces;
   means for applying a potential difference between said first and second electrodes to produce an electric field in each said layer, said electric field causing a force in each said layer along the length of said stack for positioning the load; and preload means wherein said preload means includes:
an actuator rod passing through said central passage;
a preload spring connected to said actuator rod; and
means, connected to said actuator rod, for urging said preload spring against said stack.

2. An actuator according to claim 1, wherein said electrically positive surface and said electrically negative surface of each of said elements are coated with a vacuum deposition of tungsten-gold film.

3. An actuator according to claim 2, wherein said film is approximately 6 micro-inches thick.

4. An actuator according to claim 2, wherein said electrically positive surface and said electrically negative surface of each of said elements are polished flat before being coated with said tungsten-gold film.

5. An actuator according to claim 1, wherein said actuator requires not greater than 200 VDC to achieve the maximum deformation along the length of said stack.

6. An actuator for selectively bending a laser mirror, comprising:
a plurality of layers of a piezoelectric material, each of the layers in said plurality being not greater than 4 mils in thickness, each of said layers being electrically polarized to have an electrically positive surface and an electrically negative surface, said layers being positioned to form a stack such that adjacent surfaces have like electrical polarities;
electrode means interdigitated between said layers for applying an electrical potential difference between said electrically positive surface and said electrically negative surface of each said layer;
means for connecting one end of said stack to a laser mirror;
means for preloading said stack to compress said stack and to deform said laser mirror to a predetermined configuration; and
means for applying an electrical signal to said electrode means to produce an electric field in each said layer, said electric field producing a force in each said layer along the length of said stack for selectively varying the configuration of said laser mirror.

7. An actuator according to claim 6 wherein said preloading means deforms said laser mirror to a first predetermined configuration and wherein said electrical signal permits continuous variation of the configuration of said laser mirror from said first predetermined configuration to a second predetermined configuration of maximum convexity.

8. An actuator according to claim 6 wherein said preload means includes a preload spring and means for biasing said preload spring to compressively load said stack.

9. An actuator according to claim 8 wherein said stack has a central passage therethrough, further including:
an actuator rod passing through said central passage;
means for connecting an end of said actuator rod to said laser mirror whereby said means for biasing said preload spring will also deform said laser mirror to a predetermined configuration.

10. A method for producing a force on a load, comprising the steps of:
forming a stack of a plurality of poled piezoelectric layers, each poled piezoelectric layer in said stack being not greater than 4 mils in thickness and having an electrically positive surface and an electrically negative surface;
connecting a first electrode to said electrically positive surfaces;
connecting a second electrode to said electrically negative surfaces;
preloading said stack for moving the load through a predetermined range of motion along the length of said stack; and
applying a single polarity direct current potential difference between said first and second electrodes to produce an electric field in each said poled piezoelectric layer for causing a force therein along the length of said stack for moving said load.

11. A method according to claim 10 further including the steps of:
stacking said poled piezoelectrical layers such that adjacent surfaces have like electrical polarities; and
interdigitating said first electrode and said second electrode between said electrically positive surfaces and said electrically negative surfaces.

12. A method for forming a piezoelectric ceramic actuator comprising the steps of:
forming a plurality of piezoelectric ceramic elements;
coating a first face and an opposing second face of said piezoelectric ceramic elements by deposition with an electrically conducting film to form electrodes thereon;
polarizing said piezoelectric ceramic elements to form electrically positive and negative surfaces on said first and second faces;
stacking said piezoelectric ceramic elements with adjacent surfaces thereof having like electrical polarities; and
compressively preloading said piezoelectric ceramic elements.

13. A method according to claim 12 further including the step of placing a conducting shim between each pair of said surfaces having like electrical polarities.

14. A method according to claim 12, wherein said coating step comprises:
depositing by vacuum deposition on said first face of said piezoelectric ceramic elements a tungsten-gold film approximately 6 micro-inches thick; and
depositing by vacuum depositing on said second face of said piezoelectric ceramic elements a tungsten-gold film approximately 6 micro-inches thick.

15. A method according to claim 12, further including the additional step before said coating step of polishing said first and second faces flat.

16. A method according to claim 12, wherein each of said piezoelectric ceramic elements is not greater than 4 mils thick.

17. A piezoelectric actuator for producing a longitudinal force in response to single polarity D.C. control voltage varying from zero to a value not greater than 200 volts, comprising:
a stack containing a plurality of thin, flat piezoelectric elements, each element in said plurality having flat, polished planar surfaces;
means for compressively preloading said stack;
a thin film of tungsten-gold material deposited upon said planar surfaces of each said element; and means for electrically connecting said elements in parallel to two input terminals, the planar surfaces of each pair of adjacent elements in said stack being connected to the same one of said two input terminals.

18. A piezoelectric actuator according to claim 17, wherein each of said elements are not greater than 4 mils thick.

19. A piezoelectric actuator according to claim 17, wherein said stack is polarized by application of a D.C. voltage of the same polarity and approximately twice the magnitude of said D.C. control voltage to said two input terminals.

* * * * *